United States Patent [19]
Hayano

[11] Patent Number: 5,903,489
[45] Date of Patent: May 11, 1999

[54] SEMICONDUCTOR MEMORY DEVICE HAVING A MONITORING PATTERN

[75] Inventor: Kiminori Hayano, Tokyo, Japan

[73] Assignee: NEC Corporation, Tokyo, Japan

[21] Appl. No.: 09/156,665

[22] Filed: Sep. 18, 1998

[30] Foreign Application Priority Data

Sep. 19, 1997 [JP] Japan .................................. 9-255695

[51] Int. Cl.[6] .................................................. G11C 5/02
[52] U.S. Cl. .............................. 365/51; 365/63; 365/201; 257/48; 257/620
[58] Field of Search ............................... 365/51, 63, 201; 257/48, 620

[56] References Cited

U.S. PATENT DOCUMENTS 5,285,082  2/1994  Axer .......................................... 257/48
5,771,200  6/1998  Cho et al. .......................... 365/230.03

FOREIGN PATENT DOCUMENTS 56-83955  7/1981  Japan .

OTHER PUBLICATIONS

"Nikkei Micro–device", pp. 56–58, May 1995.
"Nikkei Micro–device", pp. 77–84, Feb. 1992.
"Semiconductor World", pp. 99–101, Feb. 1995.

Primary Examiner—Andrew Q. Tran
Attorney, Agent, or Firm—Foley & Lardner

[57] ABSTRACT

A semiconductor memory device has a memory cell area and a peripheral area including a scribe area. A large number of first monitoring patterns are disposed in the scribe area for monitoring the peripheral circuit in the peripheral area, whereas a few number of second monitoring patterns are disposed adjacent to the memory cell area for monitoring the characteristics of the memory cells. A CMP process which reduces the thickness of the memory device does not generate dust of the conductive material from the scribe area because the first monitoring pattern has a level substantially equal to the level of the peripheral area.

5 Claims, 9 Drawing Sheets

SEMICONDUCTOR MEMORY DEVICE HAVING A MONITORING PATTERN

BACKGROUND OF THE INVENTION (a) Field of the Invention

The present invention relates to a semiconductor memory device having a monitoring pattern and, more particularly, to the arrangement of the monitoring patterns for monitoring the characteristics of memory cells and peripheral circuits in the semiconductor memory device.

(b) Description of the Related Art

Some conventional semiconductor memory devices have monitoring patterns for monitoring whether or not the transistors and interconnects formed on the product chip have desired characteristics. JP-A-56(1981)-83955, for example, proposes such a monitoring pattern in a semiconductor memory device. The monitoring pattern is generally disposed in the peripheral area or corner region of the product chip in view that there is scarcely any marginal area for the monitoring pattern in the central area or memory cell area of the memory device wherein a large number of transistors are integrated.

FIG. 1 is a partial top plan view of a conventional product chip of a memory device for showing an arrangement of the monitoring patterns. The monitoring patterns 13a, 13b and 13c are disposed in a space between bonding pads 12 and the corner region of the product chip 11.

FIG. 2 shows the detailed structure of one of the monitoring patterns in FIG. 1. The monitoring pattern shown therein has a specific pattern structure for monitoring the characteristics of a MOS transistor, and includes a pair of diffused regions 15, a gate electrode 14 made of polycrystalline silicon (polysilicon), and a plurality of through-holes 17 formed on the diffused region 15, which are similar to those in the memory cells. The monitoring pattern also includes pads 16 for deriving or inputting signals from and to the diffused regions 16 and the gate electrode 14.

The provision of the monitoring patterns in the product chip significantly increases the chip area for the product chip, because a large number of monitoring patterns should be provided for monitoring the characteristics of the semiconductor elements and interconnects in the product chip. For example, in a CMOS memory device, the monitoring patterns include at least two MOS monitoring patterns for monitoring nMOS and pMOS transistors, and threshold monitoring patterns for monitoring respective thresholds of transistors if there are a plurality of transistors having different thresholds. Separate monitoring patterns should be provided for the transistors in the memory cell. Moreover, other monitoring patterns should also be provided for monitoring characteristics of interconnects, such as electric resistance of polysilicon or refractive metals and through-holes, or withstand voltage or capacitance of the capacitor.

Among the proposals for suppressing the increase of the chip area accompanied by provision of the monitoring patterns, there is a proposal of "Test Element Group (TEG) Chip", wherein a large number of monitoring patterns are integrated in a single chip dedicated for monitoring ("Nikkei Micro-device", May 1995, pp. 56–58). FIG. 3 shows the proposed semiconductor wafer having TEG chips, wherein a large number of product chips 11 and a plurality of TEG chips 23 for monitoring the product chips 11 are arranged on the single wafer 21. By this proposal, the problem increase of the chip area does not arise; however, there arise other problems of complicated exposure steps for different chips, which causes reduction in the throughput of the fabrication of wafers, and a reduced yield of the chips from a single wafer.

There is another proposal in the above-mentioned publication, wherein monitoring patterns are provided on the scribe areas of the semiconductor wafer. FIG. 4 shows a partial top plan view of the proposed semiconductor wafer, wherein a plurality of monitoring patterns 13 are arranged along a stripe scribe areas 24 disposed for dicing the wafer into a plurality of product chips 11 after the completion of the monitoring. The proposed wafer solves the problem increase in the chip area of the product chips. The proposed wafer also solves the problem complicated exposure steps because the monitoring patterns 13 can be exposed concurrently with the exposure for the product chips 11. In view of these advantages, the proposed wafer is increasingly employed in the current fabrication process for the semiconductor memory device.

The proposed wafer, however, raises other problems in that dust of conductive materials is generated to degrade the yield of the product chips when a new fabrication technique is employed for the semiconductor memory devices, as detailed below.

First, the problem dust arises when a chemical-mechanical polishing (CMP) technique, such as described in "Semiconductor World", pp.99–101, Feb. 1995, is employed for planarization of the semiconductor chip. The CMP technique generally tends to expose the interconnect layers in the monitoring patterns formed on the scribe area, and raises the problem dust due to the peel-off of the conductive materials. This problem occurs especially in the structure of the DRAM, as shown in FIG. 5, wherein the memory cell area is higher than the peripheral area.

In FIG. 5, a memory cell in the memory cell area 22 includes a memory cell transistor having a pair of diffused regions 15a and 15b, or 15b and 15c, and a gate electrode 14a, or 14b, and a storage capacitor overlying the memory cell transistor and having a bottom electrode 31 and a top electrode 32. The peripheral area 20 includes a transistor having a pair of diffused regions 15d and 15e and a gate electrode 14c, which are similar to those in the memory cell area. Both the transistors in the memory cell area 22 and the peripheral area 20 have a substantially equal structure, and accordingly, the level of the memory cell area 22 is higher than the level of the peripheral area 20 because of the presence of the capacitor. In a typical 64 Mega-bit DRAM, the top electrode 32 of the storage capacitor has a thickness of 1500 to 2500 angstroms and the bottom electrode 31 has a thickness of 5000 to 8000 angstroms, which causes the difference of the level around 1 μm between the memory cell area 22 and the peripheral area 20. In this configuration, it is difficult to completely planarize an insulation film 33 in both the areas 22 and 20 by the CMP technique, and accordingly, the resultant geometry depends on the levels of the underlying layers in both the areas 22 and 20.

Some of the monitoring patterns disposed in the scribe area for monitoring the characteristics of the memory cells have a level equal to the level of the memory cell. Accordingly, in the vicinity of the scribe area, monitoring patterns having a smaller space and a higher level than the peripheral area exist adjacent to the peripheral area having a larger space and a lower level. This raises difficulty in the CMP technique, and the resultant geometry of the monitoring patterns after the CMP process is generally based on the level of the peripheral area, resulting in a lower level of the monitoring patterns.

FIG. 6 schematically shows the geometry of the typical DRAM before and after the CMP process. In the drawing, the memory cells and the monitoring pattern each including transistors and a capacitor are shown by hatched boxes 10 and 18. As understood from the drawing, the top insulator film 33 after the deposition thereof has a smaller thickness in the monitoring pattern 10 compared to the memory cells 18 due to the lower level of the peripheral area. That is, the thickness of the top insulator layer 33 is generally uniform in the peripheral area and in the scribe area. Accordingly, after the CMP process, as shown by a chain line, the top electrode of the monitoring pattern tends to be exposed, which causes dust of the conductive materials to be scattered on the wafer, thereby degrading the characteristics of the memory device and thus the yield thereof.

Second, the problem dust arises in a step for removing a polyimide film if a large scale chip such as for a DRAM is fabricated by a lead on chip (LOC) technique, which is described in "Nikkei Micro-device", Feb. 1992, pp 77–84. The LOC process can save a conventional die pad for supporting the product chip by arranging an inner lead on the product chip (i.e., lead on chip), the inner lead having a function for supporting and fixing the product chip as well as an ordinary function for transmitting input/output signals to and from the chip.

FIG. 7 shows the product chip fabricated by the LOC technique before dicing of the wafer. An inner lead 36 is bonded to the product chip for supporting the product chip with an intervention of an adhesive tape 37 and a polyimide film 38 therebetween. The polyimide film 38 functions for alleviating the stress applied to the product chip from the adhesive tape 37. A passivation film 39 covers the surface of the entire product chip except for the scribe area 24. In this configuration, the polyimide film 38 as well as the passivation film 39 has been removed from the scribe area 24 in view that the polyimide film 38 and the passivation film 39 may obstruct the dicing of the wafer. In the polyimide removing step, the monitoring pattern may also be exposed in the scribe area 24. Especially, if combined with the CMP process, the polyimide removing step exposes the top electrode of the monitoring pattern, which causes the problem dust of the conductive materials.

SUMMARY OF THE INVENTION

In view of the above, it is an object of the present invention to provide a semiconductor memory device having a monitoring pattern in a scribe area, and capable of suppressing the increase of the chip area of the product chip, solving the problem dust as described above and improving the yield of the product chips.

The present invention provides a semiconductor memory device comprising a memory cell area including a plurality of memory cells, a peripheral area including a peripheral circuit for controlling the memory cells, the peripheral area including a scribe area at an outer periphery thereof, a first monitoring pattern disposed in the scribe area, the first monitoring area having a level substantially equal to a level of the peripheral circuit, and a second monitoring pattern disposed in an area other than the scribe area, the second monitoring pattern having a level substantially equal to a level of the memory cells.

In accordance with the semiconductor memory device of the present invention, since the second monitoring pattern having a structure similar to that of the memory cell is disposed in an area other than the scribe area, the CMP process or polyimide removing process for the scribe area does not generate dust of conductive materials from the first monitoring pattern which has a level substantially equal to the level of the peripheral area.

The above and other objects, features and advantages of the present invention will be more apparent from the following description, referring to the accompanying drawings.

PREFERRED EMBODIMENTS OF THE INVENTION

Figure 1:
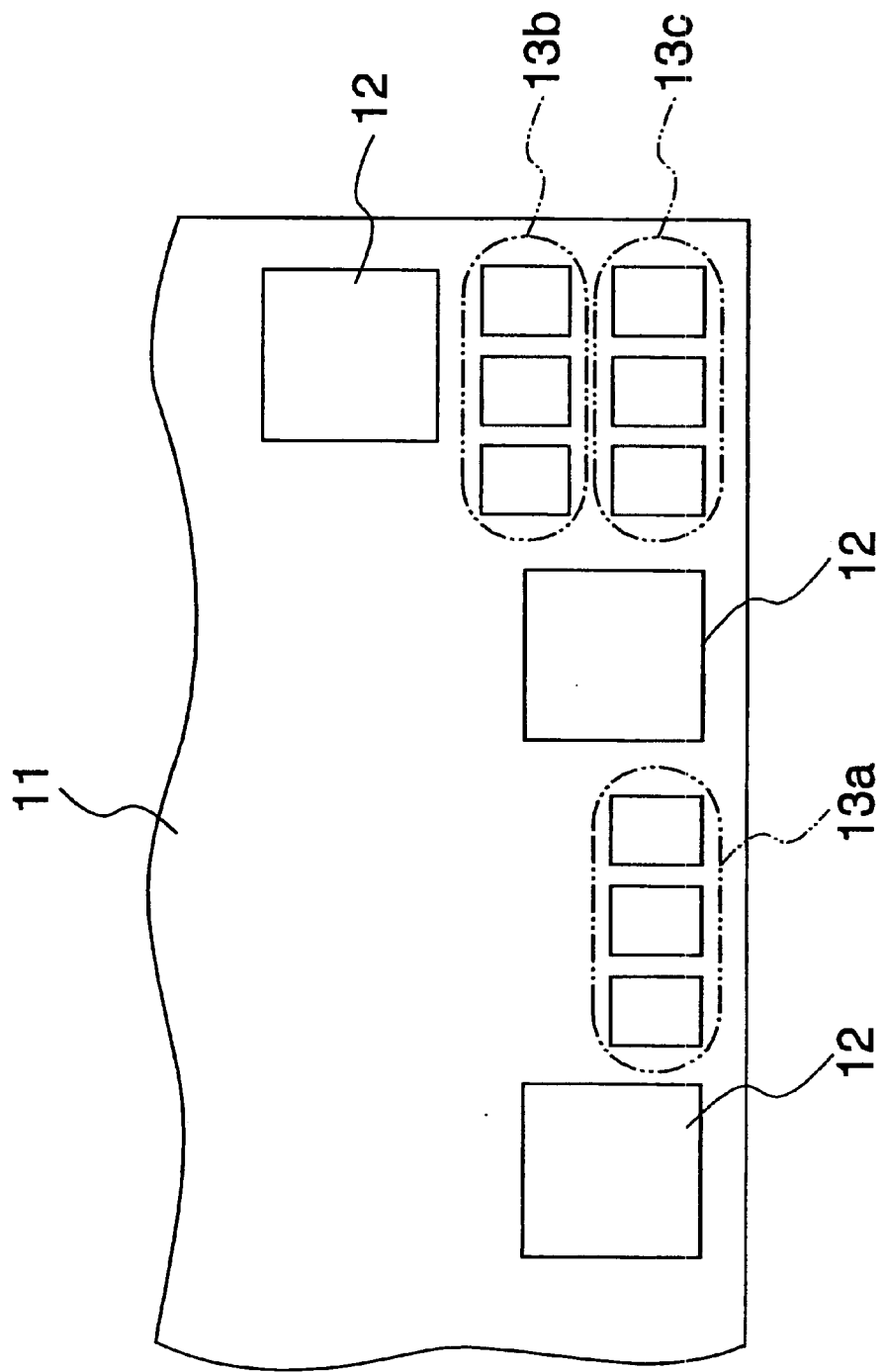
FIG. 1 is a partial top plan view of a conventional semiconductor memory device for showing an arrangement of monitoring patterns.
Figure 2:
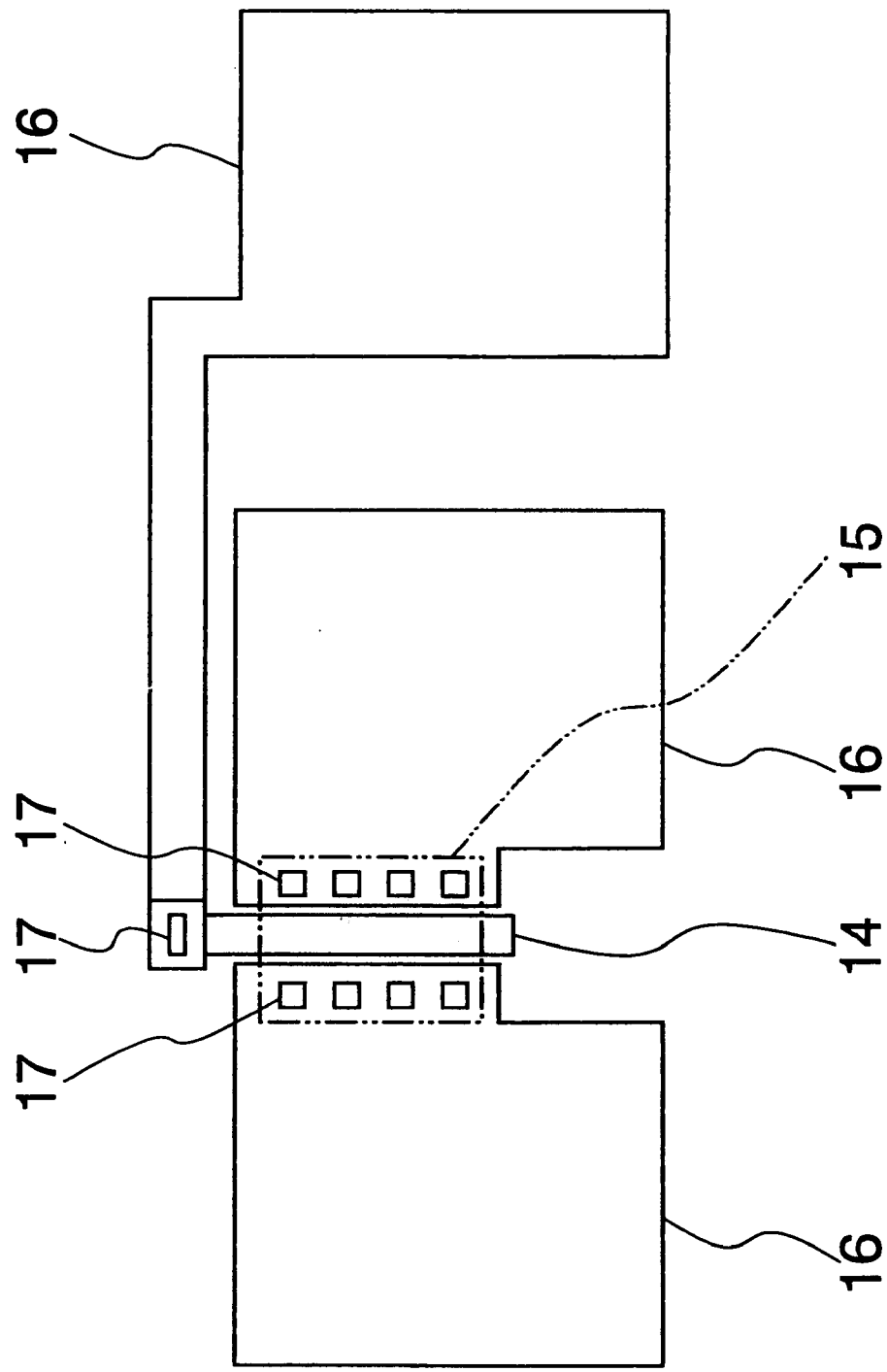
FIG. 2 is a top plan view of the monitoring pattern shown in FIG. 1.
Figure 3:
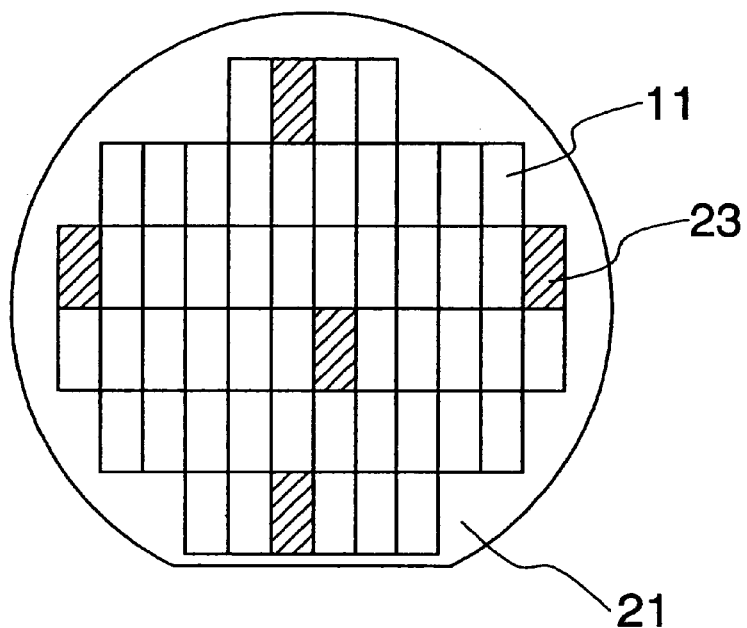
FIG. 3 is a top plan view of a conventional semiconductor wafer for showing an arrangement of TEG chips.
Figure 4:
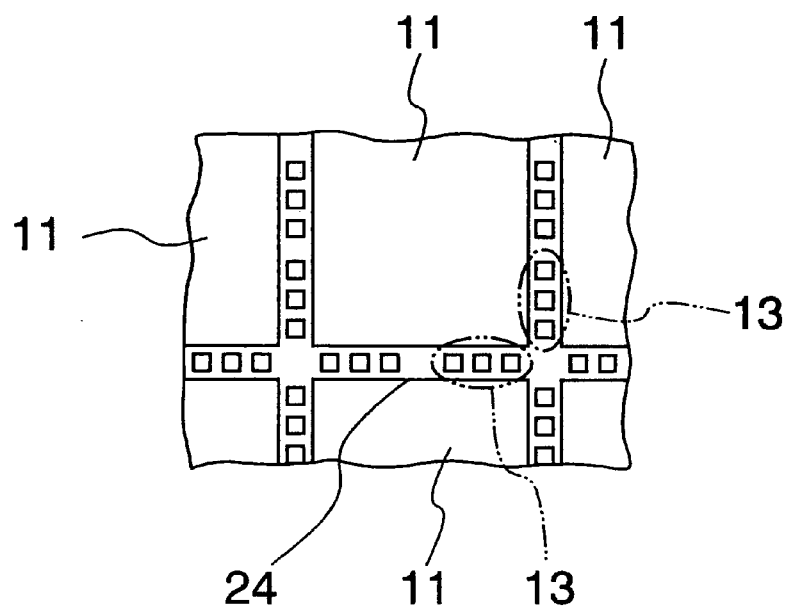
FIG. 4 is a parial top plan view of another conventional semiconductor wafer for showing an arrangement of monitoring patterns in scribe areas.

Now, the present invention is more specifically described with reference to accompanying drawings, wherein similar constituent elements are designated by similar reference numerals throughout the drawings.

Figure 8:
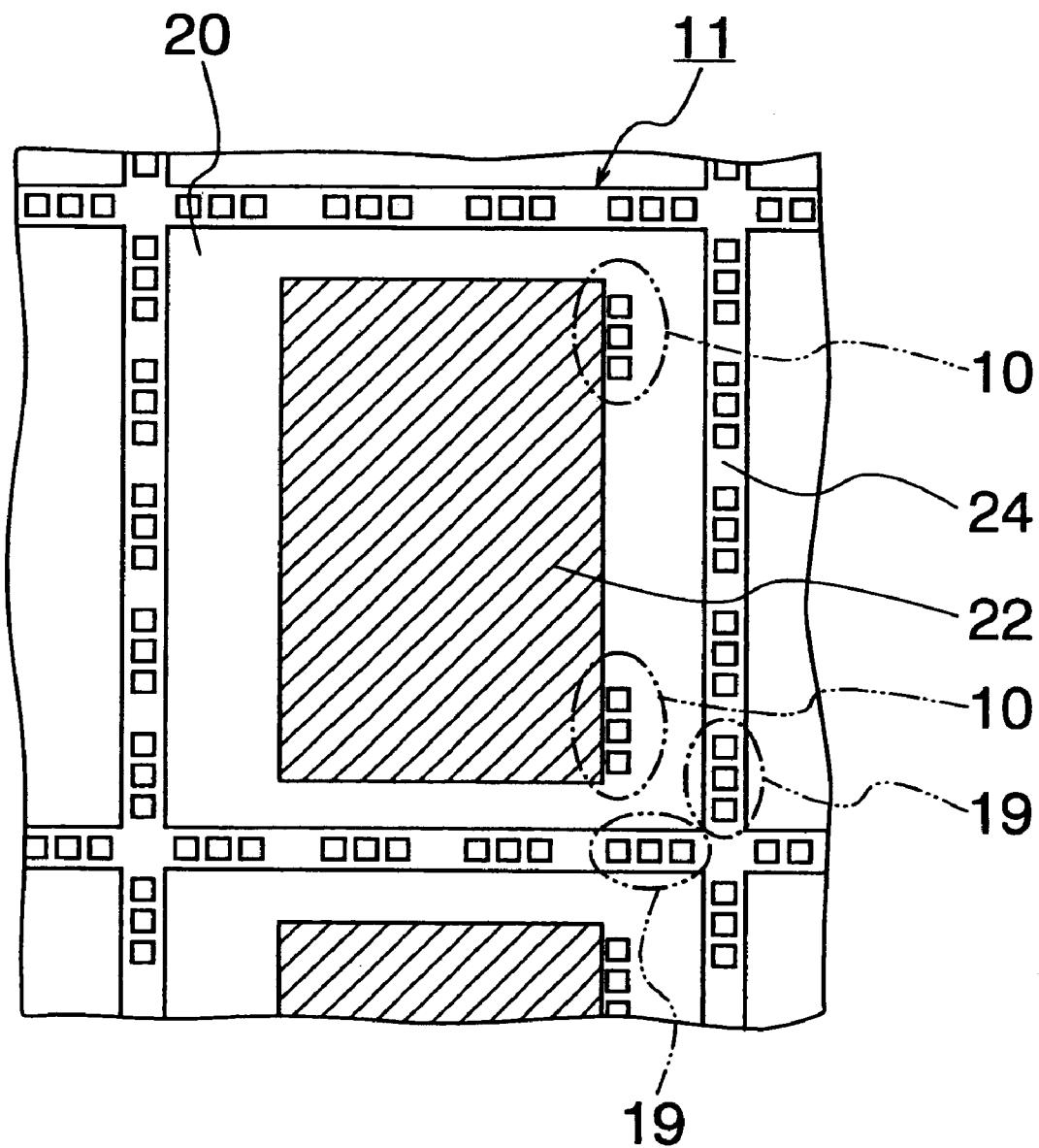
FIG. 8 is a top plan view of a semiconductor memory device according to a first embodiment of the present invention.

Referring to FIG. 8, a semiconductor wafer has thereon a plurality of memory devices or product chips 11 according to a first embodiment of the present invention. Each of the product chips 11 includes a memory cell area 22 for receiving therein an array of memory cells, and a peripheral area 20 for receiving therein peripheral circuits for controlling the memory cell area 22. The peripheral area 20 includes stripe scribe areas 24 as part of the peripheral area 20. The product chips 11 are separated by dicing of the wafer along the stripe scribe areas 24 from one another after the tests for the chips including monitoring the characteristics of the memory device are completed.

The scribe areas 24 receive therein a plurality of first monitoring patterns 19 aligned along the stripe scribe areas 24 for monitoring the characteristics of various elements in the memory device except for the structure of the memory cells. Second monitoring patterns 10 for monitoring the characteristics of the memory cells in the memory cell area 22 are disposed in the peripheral area 20 of the semiconductor chip 11 adjacent to the memory cell area 22. The number of the second monitoring patterns 10 is considerably small compared to the number of the first monitoring patterns 19, and accordingly, the second monitoring patterns 10 thus provided do not significantly increase the chip area of the product chip 11. In the illustrated embodiment, two of the second monitoring patterns 10 are disposed adjacent to each memory cell area 22. The structure of the memory device of FIG. 8 is similar to that described with reference to FIG. 5 except for the location of the second monitoring patterns 10.

Figure 9:
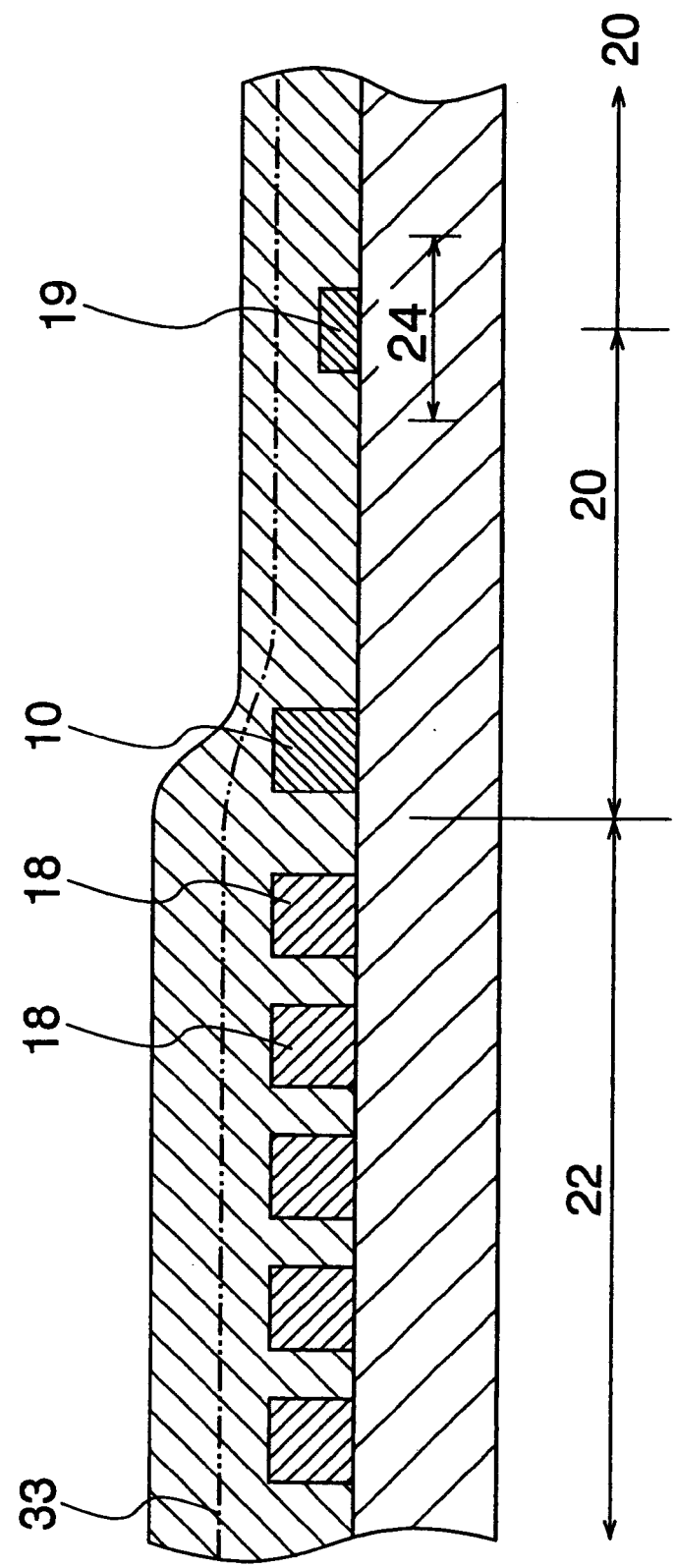
FIG. 9 is a cross-sectional view of the semiconductor memory device of FIG. 8.

Referring to FIG. 9 showing the semiconductor wafer of FIG. 8 in a schematic cross-sectional view, the structure of the memory cells 18 and the monitoring patterns 19 and 10 are shown by hatched boxes for abbreviation. The second monitoring patterns 10 for monitoring the memory cells 18 are disposed in the peripheral area 20 adjacent to the memory cell area 22, and accordingly, have a level substantially equal to the level of the memory cells 18 after formation of an insulation film 33 as well as after the CMP process. The first monitoring patterns 19 formed in the scribe area 24 have a level substantially equal to the level of the peripheral area 20. Accordingly, the CMP process does not expose the monitoring patterns 10 and 19, and thus does not cause the problem dust of the conductive material.

In the present embodiment, the second monitoring patterns 10 need not be disposed in close to the location of the memory cell area 22, and may be disposed in the area wherein a substantially equal level can be obtained for the second monitoring patterns 10 and the memory cell area 22. The second monitoring patterns 10 may be disposed significantly away from the memory cell area 22 depending on the degree of flatness of the insulating film 33.

Figure 5:
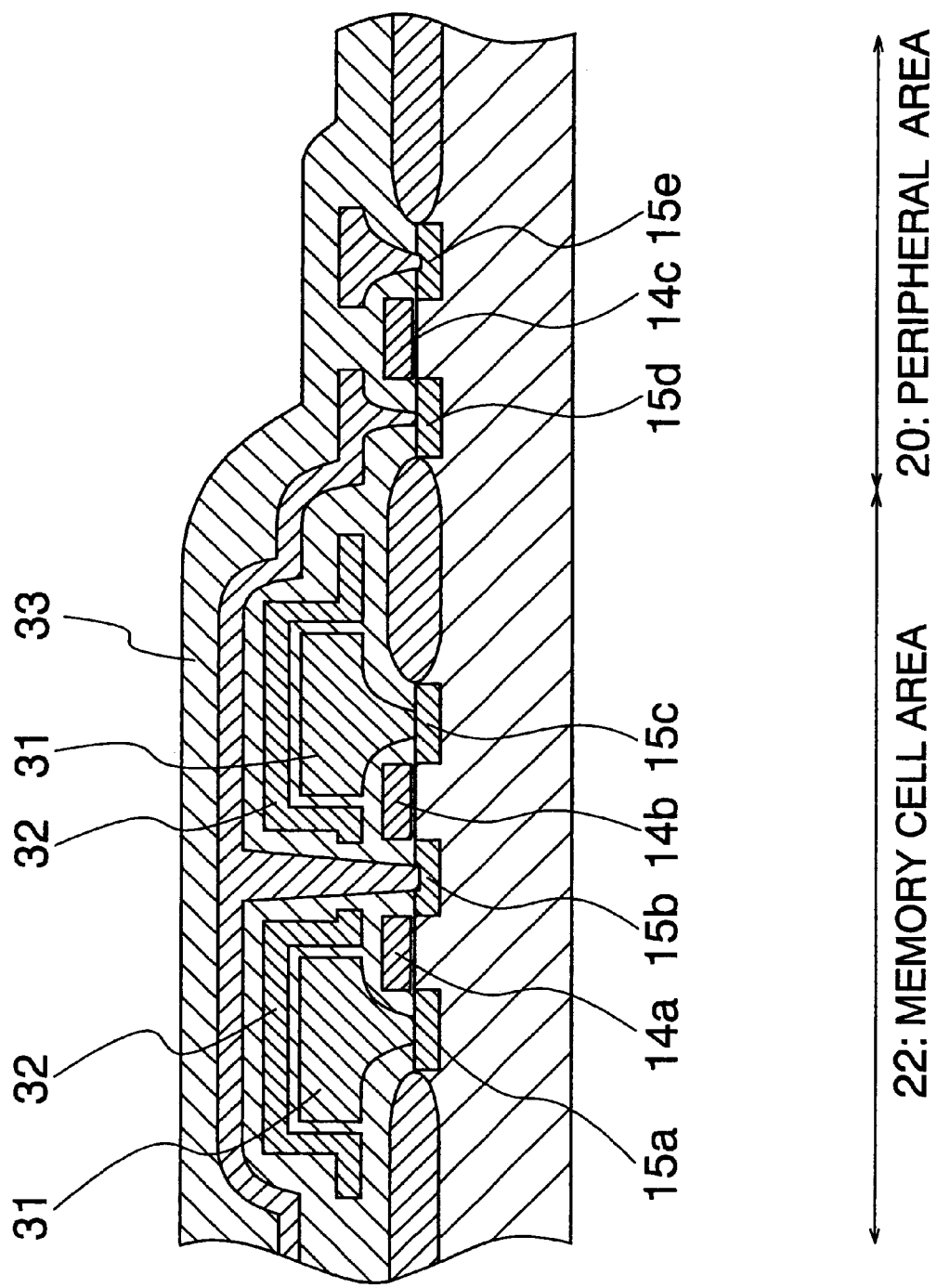
FIG. 5 is a cross-sectional view of the semiconductor wafer of FIG. 4.
Figure 6:
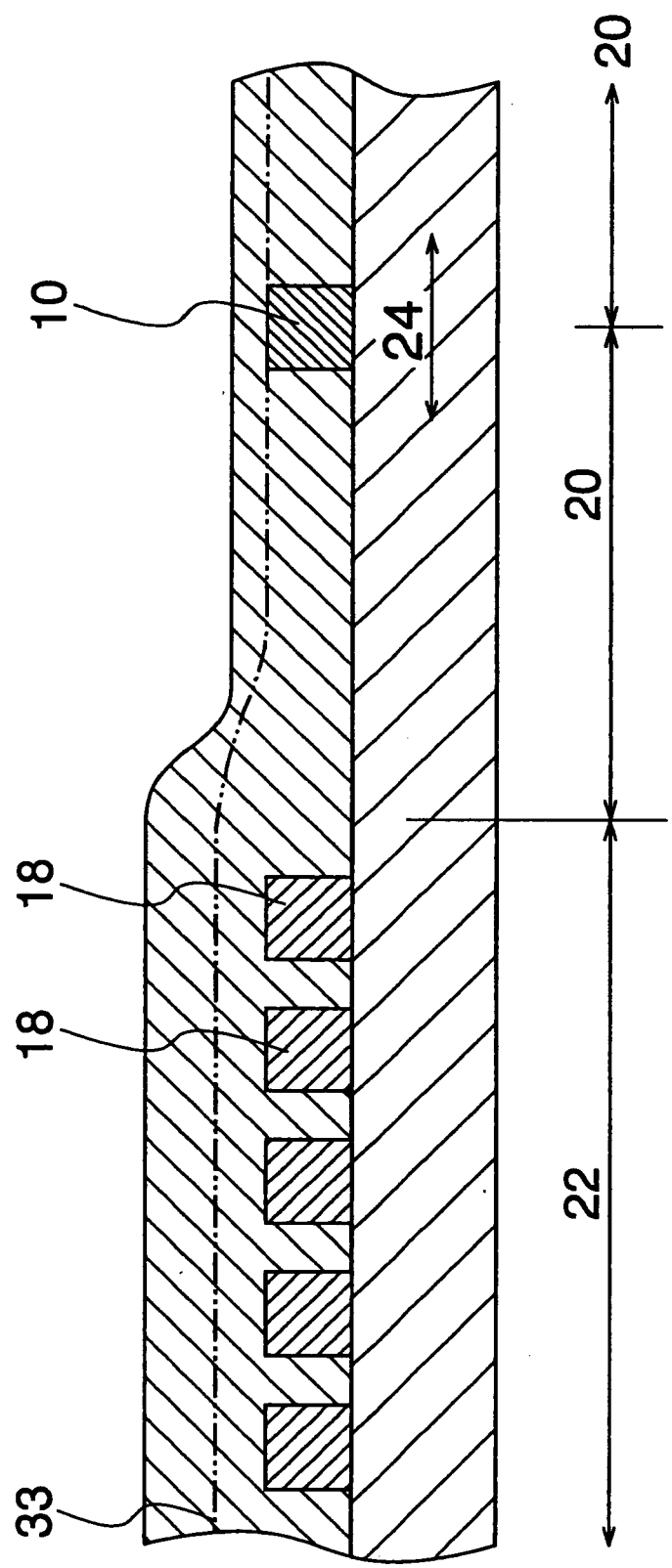
FIG. 6 is a schematic cross-sectional view of the conventional semiconductor wafer of FIG. 4 for showing generation of dust.
Figure 7:
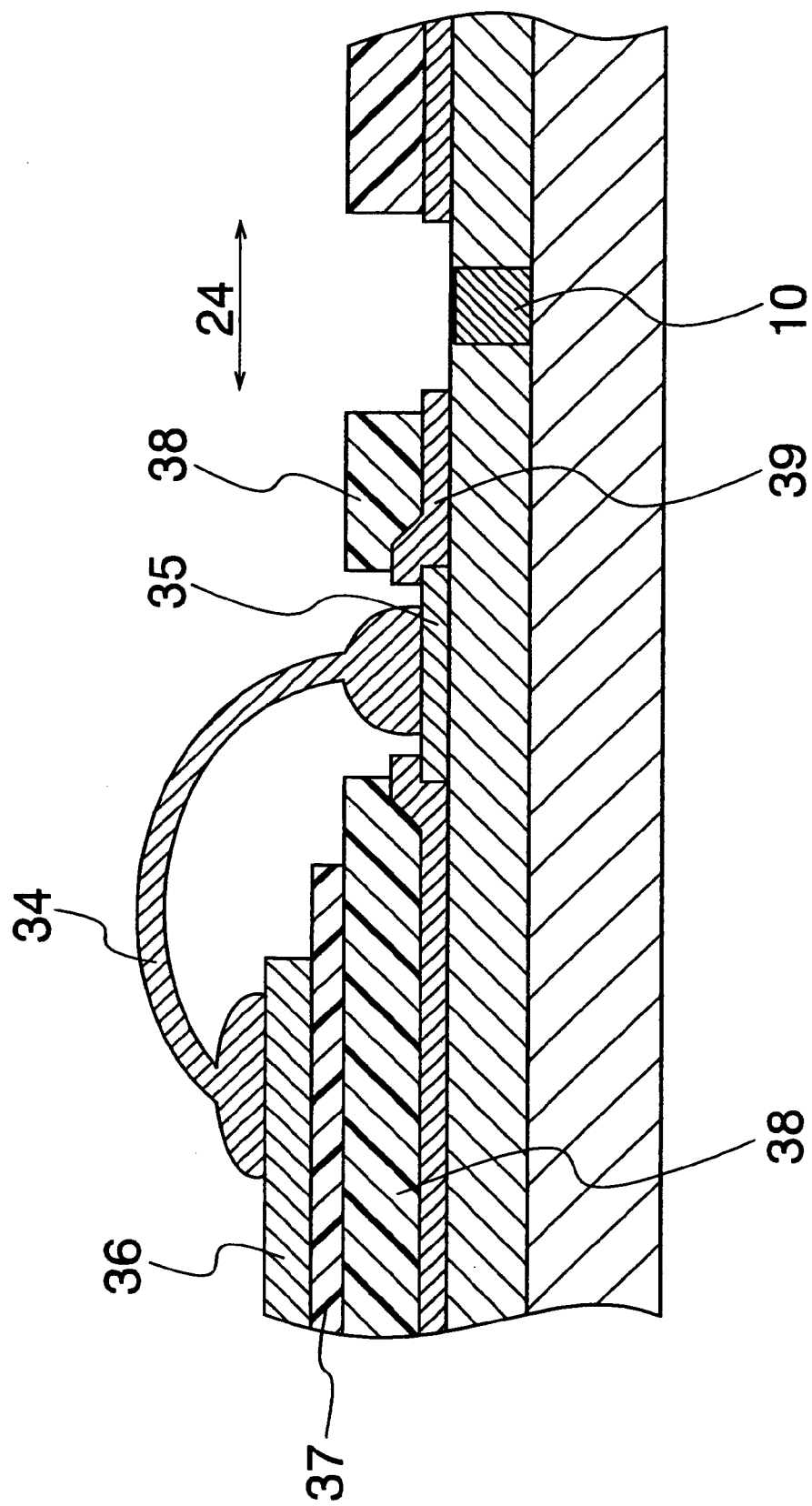
FIG. 7 is a cross-sectional view of a conventional semiconductor wafer using a LOC technique.
Figure 10:
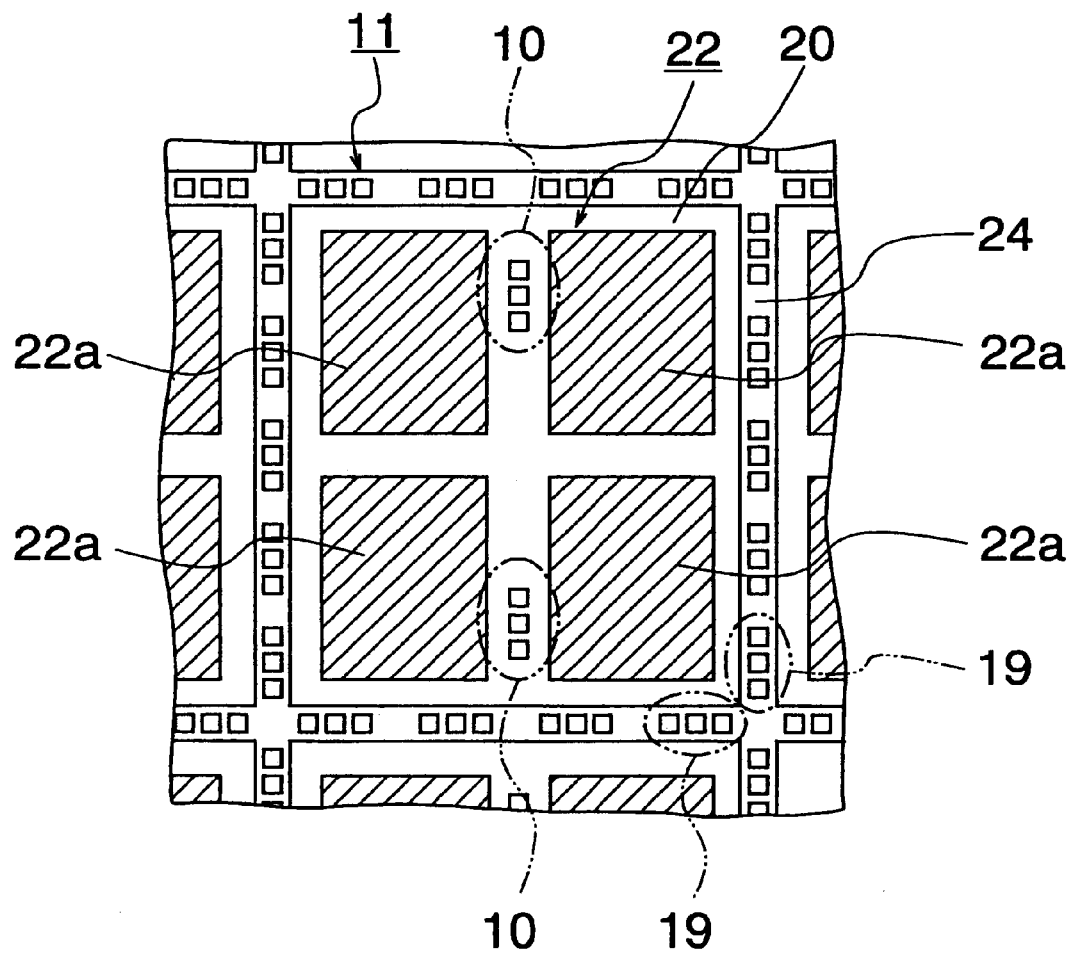
FIG. 10 is a top plan view of a semiconductor memory device according to a second embodiment of the present invention.

Referring to FIG. 10 showing a semiconductor memory device according to a second embodiment of the present invention, a plurality of memory blocks 22*a* each including an array of memory cells are disposed in the memory cell area 22 of the memory device or product chip 11. The second monitoring patters 10 are disposed in a space between the memory blocks 22*a*. Other configuration is similar to that in the first embodiment. In the present embodiment, since the space between the memory blocks 22*a* is small compared to the memory blocks 22*a*, the thickness of the insulation film 33 (such as shown in FIG. 5) is substantially uniform between the space and the memory blocks 22*a*. Accordingly, the second monitoring patterns 10 need not be disposed in close to the memory blocks 22.

Since the above embodiments are described only for examples, the present invention is not limited to the above embodiments and various modifications or alterations can be easily made therefrom by those skilled in the art without departing from the scope of the present invention. For example, the product chip need not be a DRAM, and may be a SRAM or other semiconductor devices such as logic devices integrated with a memory device. In this text, such a logic device may be also called peripheral circuit.

What is claimed is:

1. A semiconductor memory device comprising a memory cell area including a plurality of memory cells, a peripheral area including a peripheral circuit for controlling said memory cells, said peripheral area including a scribe area at an outer periphery thereof, a first monitoring pattern disposed in said scribe area, said first monitoring pattern having a level substantially equal to a level of said peripheral circuit, and a second monitoring pattern disposed in an area other than said scribe area, said second monitoring pattern having a level substantially equal to a level of said memory cells.

2. A semiconductor memory device as defined in claim 1, wherein said second monitoring pattern has a structure for monitoring characteristics of said memory cell.

3. A semiconductor memory device as defined in claim 1, wherein said first monitoring pattern has a structure for monitoring characteristics of said peripheral area.

4. A semiconductor memory device as defined in claim 1, wherein said second monitoring pattern is disposed adjacent to said memory cell area.

5. A semiconductor memory device as defined in claim 1, wherein said memory cell area includes a plurality of memory blocks each including an array of memory cells, and said second monitoring pattern is disposed in a space between said memory blocks.

* * * * *